(12) United States Patent
Peng et al.

(10) Patent No.: US 10,790,795 B1
(45) Date of Patent: Sep. 29, 2020

(54) ZEROING STRUCTURE APPLICABLE TO ADJUSTABLE DIPLEXER

(71) Applicant: Universal Microwave Technology, Inc., Keelung (TW)

(72) Inventors: Jen-Ti Peng, Keelung (TW); Chien-Chih Lee, Taipei (TW); Cheng-Lung Wu, New Taipei (TW); Tsung-Hsien Tsai, Taichung (TW); Chia-Hao Hsu, Keelung (TW); Chih-Sheng Tsai, Taichung (TW)

( * ) Notice: Subject to any disclaimer, the term of this patent is extended or adjusted under 35 U.S.C. 154(b) by 0 days.

(21) Appl. No.: 16/726,845

(22) Filed: Dec. 25, 2019

(51) Int. Cl.
- *H03H 7/01* (2006.01)
- *H03H 7/46* (2006.01)
- *H01P 1/201* (2006.01)

(52) U.S. Cl.
CPC ............. *H03H 7/465* (2013.01); *H01P 1/201* (2013.01); *H03H 7/17* (2013.01)

(58) Field of Classification Search
CPC ...... H01P 7/00; H01P 7/04; H01P 7/06; H01P 7/065; H01P 7/10; H01P 7/105; H01P 1/201; H01P 1/202; H01P 1/213; H01P 1/2133; H01P 1/205; H01P 1/2053; H03H 7/463; H03H 7/465; H03H 7/01; H03H 7/17
USPC ....... 333/132, 133, 134, 135, 207, 209, 206, 333/202
See application file for complete search history.

(56) References Cited

U.S. PATENT DOCUMENTS

| | | | | |
|---|---|---|---|---|
| 6,147,577 | A | * | 11/2000 | Cavey ................... H01P 1/2084 333/209 |
| 2003/0043071 | A1 | * | 3/2003 | Lilly .................... H01Q 3/2605 342/368 |
| 2003/0098755 | A1 | * | 5/2003 | Basawapatna .......... H01P 1/218 333/17.1 |
| 2006/0038640 | A1 | * | 2/2006 | D'Ostilio .................. H01P 7/04 333/223 |
| 2015/0280298 | A1 | * | 10/2015 | Shiroyama .............. H01P 1/207 333/202 |
| 2017/0333258 | A1 | * | 11/2017 | Trennepohl .......... A61F 13/2054 |
| 2018/0102579 | A1 | * | 4/2018 | Chen ......................... H01P 7/06 |

* cited by examiner

Primary Examiner — Stephen E. Jones

(57) ABSTRACT

A zeroing structure applicable to an adjustable diplexer includes a substrate, holder, motor, lead screw, displacement plate, stop element and interference element. The holder is disposed on the substrate. The motor is disposed on the holder. The lead screw is rotatably disposed on the holder and connected to the motor, and thus rotation of the lead screw is driven by the motor. The displacement plate is movably disposed on the substrate and helically connected to the lead screw so as to undergo linear motion between a first position and a second position relative to the substrate when guided and driven by the motor. The stop element is disposed on the lead screw. The interference element is disposed on the displacement plate and at the position that allows the interference element to come into contact with the stop element when the displacement plate is at the first position. The zeroing structure enables the adjustable diplexer operable at an adjustable center frequency to perform mechanical zeroing and enables primary or auxiliary confirmation of zeroing detection. Furthermore, the zeroing structure is highly reliable and incurs low cost.

5 Claims, 3 Drawing Sheets

US 10,790,795 B1

ZEROING STRUCTURE APPLICABLE TO ADJUSTABLE DIPLEXER

BACKGROUND OF THE INVENTION

Field of the Invention

The present disclosure relates to a diplexer and, more particularly, to a zeroing structure applicable to an adjustable diplexer.

Description of the Prior Art

Conventional filter manufacturing processes entail performing a measuring process with a network analyzer and correcting adjustably the center frequency of a filter manually. However, no adjustment may be carried out after completion of a packaging process.

To overcome the aforesaid drawback, prior art discloses an adjustable diplexer operable at an adjustable center frequency and capable of adjusting the center frequency in accordance with how deep a controllably movable post protrudes into the cavity of a microwave body.

The adjustable diplexer only uses a Hall switch to detect whether to perform zeroing. However, in case of damage done to electronic circuit components by a power interruption or a lightning strike, stored data and system settings will get lost, and in consequence records of zeros will vanish. As a result, this poses a risk of zeroing failure.

SUMMARY OF THE INVENTION

It is an objective of the present disclosure to provide a zeroing structure which renders an adjustable diplexer capable of mechanical zeroing.

In order to achieve the above and other objectives, the present disclosure provides a zeroing structure comprising a substrate, a holder, a motor, a lead screw, a displacement plate, a stop element and an interference element. The holder is disposed on the substrate. The motor is disposed on the holder. The lead screw is rotatably disposed on the holder and connected to the motor, and thus rotation of the lead screw is driven by the motor. The displacement plate is movably disposed on the substrate and helically connected to the lead screw, and thus the displacement plate is guided and driven by the motor to undergo linear motion between a first position and a second position relative to the substrate. The stop element is disposed on the lead screw. The interference element is disposed on the displacement plate and at the position that allows the interference element to come into contact with the stop element when the displacement plate is at the first position.

In one embodiment, the displacement plate has thereon two mounting portions flanking the lead screw symmetrically, and the interference element is mounted on one of the two mounting portions.

In one embodiment, the mounting portions are each a screw hole.

In one embodiment, the stop element comprises an arm and a screw nut disposed near the arm, and the arm is helically coupled to the lead screw.

In one embodiment, the interference element has a bump corresponding in position to the arm and being able to come into contact with the arm, and a width of the bump is less than a width of the displacement plate.

Therefore, in an embodiment of the present disclosure, the zeroing structure enables the adjustable diplexer operable at an adjustable center frequency to perform mechanical zeroing and enables primary or auxiliary confirmation of zeroing detection. Furthermore, the zeroing structure is highly reliable and incurs low cost.

DETAILED DESCRIPTION OF THE INVENTION

The technical characteristics, contents, advantages and effects of the present invention will become apparent from the following detailed description taken with the accompanying drawing.

In the disclosure, descriptive terms such as "a" or "one" are used to describe the units, component, structure, devices, portions or regions, and are for illustration purposes and providing generic meaning to the scope of the present invention. Therefore, unless otherwise explicitly specified, such description should be understood as including one or at least one, and a singular number also includes a plural number.

In the disclosure, descriptive terms such as "include, comprise, have" or other similar terms are not for merely limiting the essential elements listed in the disclosure, but can include other elements that are not explicitly listed and are however usually inherent in the units, component, structure, devices, portions or regions.

In the disclosure, the terms similar to ordinals such as "first" or "second" described are for distinguishing or referring to associated identical or similar units, component, structure, devices, portions or regions and do not necessarily imply the orders of these units, component, structure, devices, portions or regions in a spatial aspect. It should be understood that, in some situations or configurations, the ordinal terms could be interchangeably used without affecting the implementation of the present invention.

Figure 1:
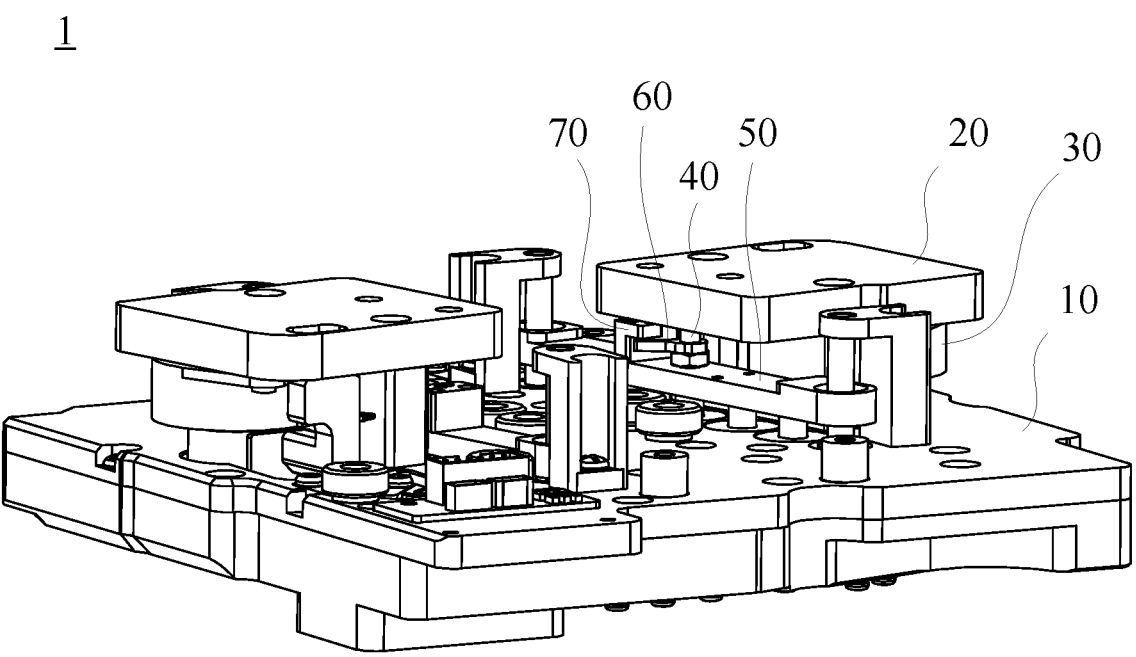
FIG. 1 is a schematic view of a zeroing structure according to an embodiment of the present disclosure.
Figure 2:
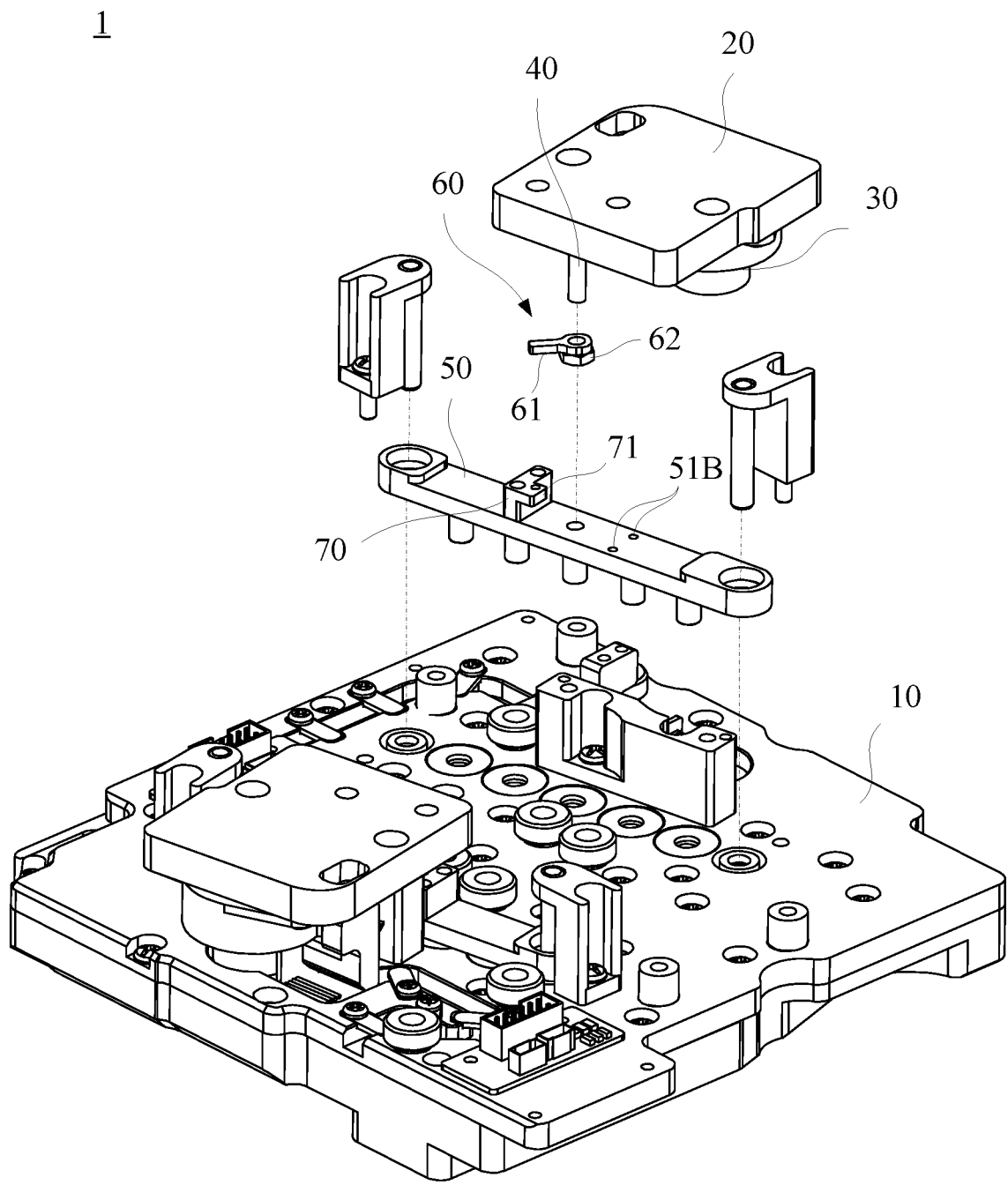
FIG. 2 is a partial exploded view of the zeroing structure according to an embodiment of the present disclosure.
Figure 3:
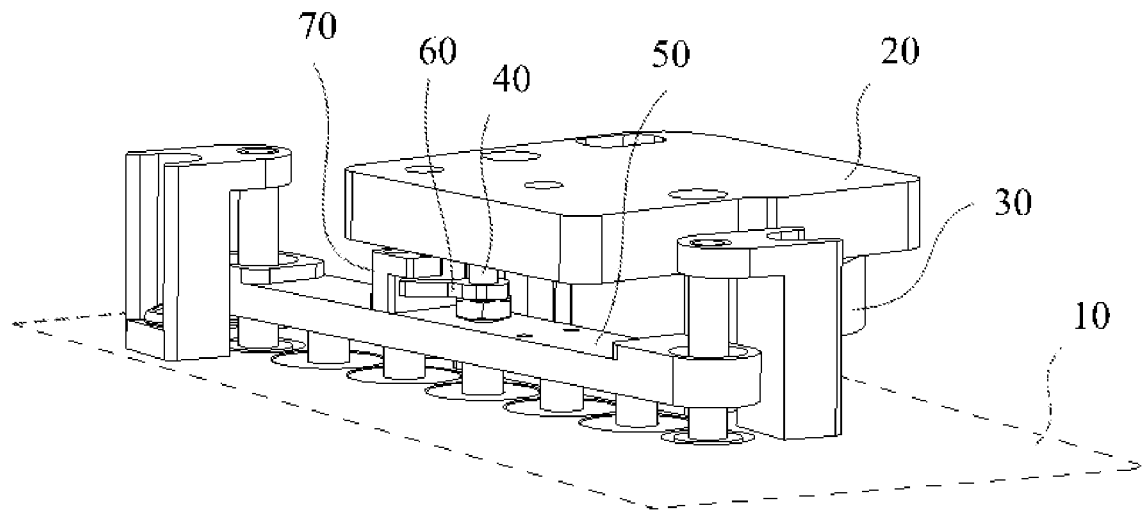
FIG. 3 is a partial enlarged view of the zeroing structure according to an embodiment of the present disclosure.

Referring to FIG. 1 through FIG. 3, FIG. 1 is a schematic view of a zeroing structure according to an embodiment of the present disclosure, FIG. 2 is a partial exploded view of the zeroing structure according to an embodiment of the present disclosure, and FIG. 3 is a partial enlarged view of the zeroing structure according to an embodiment of the present disclosure.

In this embodiment, the zeroing structure is applicable to an adjustable diplexer 1. The adjustable diplexer 1 essentially comprises a substrate 10, a holder 20, a motor 30, a lead screw 40 and a displacement plate 50. The zeroing structure essentially comprises a stop element 60 and an interference element 70.

As shown in the diagrams, the holder 20 is disposed on the substrate 10. The motor 30 is disposed on the holder 20. The lead screw 40 is rotatably disposed on the holder 20 and connected to the motor 30, and thus rotation of the lead screw 40 is driven by the motor 30. For example, a driving shaft (not shown) of the motor 30 is connected to the lead screw 40 by a gear (not shown). The displacement plate 50 is movably disposed on the substrate 10 and helically connected to the lead screw 40, and thus the displacement plate 50 is guided and driven by the motor 30 to undergo linear motion between a first position and a second position relative to the substrate 10. The stop element 60 is disposed at a predetermined position on the lead screw 40. The interference element 70 is disposed on the displacement plate 50 and at the position that allows the interference element 70 to come into contact with the stop element 60 when the displacement plate 50 is at the first position.

When the displacement plate 50 reaches the first position, the interference element 70 comes into contact with the stop element 60; hence, the stop element 60 is stopped, so as to prevent the rotation of the lead screw 40 and thereby reduce the output torque of the motor 30. Furthermore, a control system receives signals in the presence of any other sensing component, such as a Hall switch, so as to confirm that the displacement plate 50 is at a zeroing position.

Therefore, physical zeroing can be achieved by the zeroing structure in order to adjust the center frequency of the adjustable diplexer and thus adjust the position of the displacement plate 50 relative to the substrate 10. For example, when it comes to a stepped control system for driving a motor, the physical, auxiliary zeroing structure advantageously enables the diplexer to ensure a zeroing position from a control perspective. In a variant embodiment, the aforesaid advantage can be solely achieved by the physical zeroing structure without resorting to zero detection and confirmation of the motor step number.

In this embodiment, the zeroing structure is mechanically operated and can ensure that the zeroing mechanism of the adjustable diplexer is functioning well in the event of a failure of a digital zeroing mechanism. Furthermore, the zeroing structure is highly reliable and incurs low cost.

In this embodiment, the stop element 60 is located at a predetermined position on the lead screw 40. Owing to its internal thread, the stop element 60 can be coupled to the lead screw 40, and its position on the lead screw 40 is adjustable. Hence, the stop element 60 can be fine-tuned according to the mechanical precision or installation errors of the lead screw 40 mounted on any device. For example, the stop element 60 comprises an arm 61 and a screw nut 62. The arm 61 is helically coupled to the lead screw 40 and has an extension segment which extends by a specific length. The screw nut 62 is disposed near the arm 61 and adapted to fix the arm 61 in place. When the motor 30 is operating, the stop element 60 stays at the predetermined position and rotates synchronously together with the lead screw 40.

Figure 4:
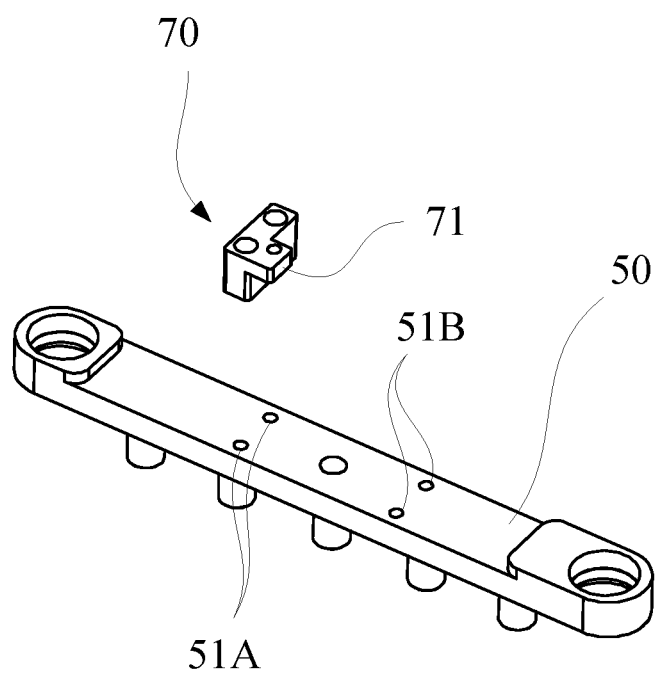
FIG. 4 is a schematic view of a displacement plate and an interference element of the zeroing structure according to an embodiment of the present disclosure.

Referring to FIG. 4, there is shown a schematic view of the displacement plate and the interference element of the zeroing structure according to an embodiment of the present disclosure.

In this embodiment, the interference element 70 has a bump 71 corresponding in position to and being able to come into contact with the arm 61 of the stop element 60. The width of the bump 71 is less than the width of the displacement plate 50. For example, the width of the bump 71 is around half of the width of the displacement plate 50. Therefore, the bump 71 of the interference element 70 can interfere with the stop element 60, even if the stop element 60 rotates by a specific range of angles relative to the lead screw 40.

Preferably, the displacement plate 50 has thereon two mounting portions 51A, 51B. The interference element 70 is mounted on one of the two mounting portions 51A, 51B, for example, the mounting portion 51A, as shown in the diagrams. The two mounting portions 51A, 51B flank the lead screw 40 symmetrically.

Therefore, the interference element 70 can be mounted on one of the two mounting portions 51A, 51B selectively as needed. Take the lead screw 40 with M3 thread as an example, when the stop element 60 rotates by 180 degrees relative to the lead screw 40, the stop element 60 undergoes a (forward or backward) displacement of 0.5 mm on the lead screw 40 to thereby allow leeway in making adjustments according to the required predetermined position of the stop element 60, so as to determine which one of the two mounting portions 51A, 51B to mount the interference element 70 on.

In this embodiment, the mounting portions 51A, 51B are each a screw hole, as shown in the diagrams, and two screw holes are disposed on the displacement plate 50 relative to each of the two sides of the lead screw 40, but the present disclosure is not limited thereto. In a variant embodiment, the two mounting portions are any other fixation-oriented structures, and the screw holes are not necessarily in the number of two even if the two mounting portions are implemented as screw holes.

In conclusion, in an embodiment of the present disclosure, the zeroing structure enables the adjustable diplexer operable at an adjustable center frequency to perform mechanical zeroing and enables primary or auxiliary confirmation of zeroing detection. Furthermore, the zeroing structure is highly reliable and incurs low cost.

While the invention has been described by means of specific embodiments, numerous modifications and variations could be made thereto by those skilled in the art without departing from the scope and spirit of the invention set forth in the claims.

What is claimed is:

1. A zeroing structure applicable to an adjustable diplexer, the adjustable diplexer comprising a substrate, a holder, a motor, a lead screw and a displacement plate, the holder being disposed on the substrate, the motor being disposed on the holder, the lead screw being rotatably disposed on the holder and connected to the motor so as to rotate when driven by the motor, the displacement plate being movably disposed on the substrate and helically coupled to the lead screw so as to undergo linear motion between a first position and a second position relative to the substrate when guided and driven by the motor, the zeroing structure comprising:
   a stop element disposed at a predetermined position on the lead screw; and
   an interference element disposed on the displacement plate and at a position that allows the interference element to come into contact with the stop element when the displacement plate is at the first position.

2. The zeroing structure applicable to an adjustable diplexer according to claim 1, wherein the displacement plate has thereon two mounting portions flanking the lead screw symmetrically, and the interference element is mounted on one of the two mounting portions.

3. The zeroing structure applicable to an adjustable diplexer according to claim 2, wherein the mounting portions are each a screw hole.

4. The zeroing structure applicable to an adjustable diplexer according to claim 3, wherein the stop element comprises an arm and a screw nut disposed near the arm, and the arm is helically coupled to the lead screw.

5. The zeroing structure applicable to an adjustable diplexer according to claim 4, wherein the interference element has a bump corresponding in position to the arm and being able to come into contact with the arm, and a width of the bump is less than a width of the displacement plate.

* * * * *